United States Patent [19]

Dhong et al.

[11] Patent Number: 4,910,709

[45] Date of Patent: Mar. 20, 1990

[54] COMPLEMENTARY METAL-OXIDE-SEMICONDUCTOR TRANSISTOR AND ONE-CAPACITOR DYNAMIC-RANDOM-ACCESS MEMORY CELL

[75] Inventors: Sang H. Dhong, Mahopac; Nicky C. Lu, Yorktown Heights; Walter H. Henkels, Putnam Valley, all of N.Y.

[73] Assignee: International Business Machines Corporation, Armonk, N.Y.

[21] Appl. No.: 230,410

[22] Filed: Aug. 10, 1988

[51] Int. Cl.[4] ............................................. G11C 11/24
[52] U.S. Cl. .................................................. 365/149
[58] Field of Search ....................................... 365/149

[56] References Cited

U.S. PATENT DOCUMENTS

| | | | |
|---|---|---|---|
| 3,457,435 | 6/1969 | Burns et al. | 307/251 |
| 3,699,544 | 10/1972 | Joynson et al. | 365/149 |
| 3,701,120 | 10/1972 | Charters et al. | 340/173 |
| 3,706,891 | 12/1972 | Donofrio et al. | 365/149 |
| 3,919,569 | 11/1975 | Gaensslen et al. | 307/304 |
| 4,044,342 | 8/1977 | Suzuki et al. | 340/173 |
| 4,203,159 | 5/1980 | Wanlass | 365/222 |
| 4,271,488 | 6/1981 | Saxe | 365/320 |
| 4,308,595 | 12/1981 | Houghton | 365/203 |
| 4,434,433 | 2/1984 | Nishizawa | 357/22 |
| 4,633,438 | 12/1986 | Kume et al. | 365/51 |

FOREIGN PATENT DOCUMENTS 175378 3/1986 European Pat. Off.

OTHER PUBLICATIONS

P. T. Wu, IBM Technical Disclosure Bulletin, vol. 23, No. 10, Mar. 1981, p. 4620, "Read/Write Dynamic Memory Using Two Devices Per Cell and Having Internal Ref.".

IBM Technical Disclosure Bulletin, vol. 18, No. 3, Aug. 1975, p. 649, "Two-Device Storage Cell", L. M. Arzubi.

Primary Examiner—James W. Moffitt
Attorney, Agent, or Firm—John J. Goodwin

[57] ABSTRACT

A complementary MOS one-capacitor dynamic RAM cell which operates with a non-boosted wordline without a threshold loss problem and which includes one storage capacitor and n- and p-type transfer devices connected to the storage capacitor which function as two complementary transistor devices having gates controlled by complementary signals on the RAM wordlines.

6 Claims, 3 Drawing Sheets

COMPLEMENTARY METAL-OXIDE-SEMICONDUCTOR TRANSISTOR AND ONE-CAPACITOR DYNAMIC-RANDOM-ACCESS MEMORY CELL

BACKGROUND OF THE INVENTION

1. Field of the Invention

The present invention relates to a semiconductor memory using complementary metal-oxide-semiconductor transistors and a storage capacitor, and more particularly to a structure and fabrication process for a random-access-memory cell for dynamic operation for large scale integrated circuit technology.

2. Description of the Prior Art

U.S. Pat. No. 4,633,438 issued Dec. 30, 1986 to Kume et al, entitled "STACKED SEMICONDUCTOR MEMORY", describes a 3-transistor random access memory for dynamic operation, in which one of the transistors is stacked on the other transistor. A transistor for writing is disposed on a transistor for reading, and one of its terminals is used in common with the gate electrode of a transistor for judging data. The other terminal is connected to one of the terminals of the transistor for reading.

A memory cell capable of extremely large scale integration can be obtained using stacked complementary FETs, wherein the two FETs are driven by overlapping wordlines; however, the wordlines are separately driven for read and write operations, rather than simultaneously driven with complementary signals as in the present invention.

U.S. Pat. NO. 4,271,488 issued Jan. 2, 1981 to Saxe entitled "HIGH-SPEED ACQUISITION SYSTEM EMPLOYING AN ANALOG MEMORY MATRIX", describes a high-speed acquisition system employing a analog memory matrix in which sample-hold elements connected to an analog bus are arranged in rows and columns to form an M x N matrix. The system is operable in a fast in - slow out mode, and the analog memory matrix may be implemented on a single integrated-circuit semiconductor chip. The analog memory comprises cells containing sample/hold circuits. Typical sample/hold circuits are shown in FIG. 2, including FIG. 2C which shows a complementary FET switching means. However, the complementary drive signals are obtained within the cell by means of inverter 54 and AND gate 52, and this patent does not show or teach the use of complementary wordlines for providing the complementary drive signals as set forth in the present invention.

U.S. Pat. No. 3,701,120 issued Oct. 24, 1972 to Charters et al, entitled "ANALOG CAPACITOR MEMORY WITH SLOW WRITE-IN AND FAST NON-DESTRUCTIVE READ-OUT" describes an analog memory capable of write-in at a relatively low rate and independent, nondestructive read-out at a relatively high rate. A single write-in add read-out address logic is provided for as memory units are desire. Each memory unit includes a matrix of sample and hold microcircuits, each having an external storage capacitor, an isolation amplifier and independent input and output analog switching in response to vertical and horizontal write-in and read-out addressing.

U.S. Pat. No. 3,457,435 issued July 22, 1969 to Burns et al, entitled "COMPLEMENTARY FIELD-EFFECT TRANSISTOR TRANSMISSION GATE", describes a circuit wherein a pair of field-effect transistors of opposite conductivity type have their source-drain paths connected in parallel. Signals of opposite polarity sense are applied at the gates of the transistors to bias both on or both off simultaneously. The gate comprising complementary FETs is driven by two complementary signals as shown in FIG. 4, in order to eliminate the drop in transmitted voltage due to the threshold voltage of a single FET. This patent does not disclose usage within a DRAM cell.

Pat. EP 175-378A of Fujitsu LTD shows three-transistor cell DRAM structure which has read and write select lines combined into one line connected to gates of both read and write select transistors. A write selector transistor is disposed over a read select transistor, the two being separated by an insulator layer and sharing a drain region. A storage transistor is formed on a silicon substrate in the same level as the read select transistor. Channel regions of the two transistors are connected to one another and each is used as a diffusion (source or drain) region of the other two transistors.

Write and read select lines may be combined into a single control line or a write/read select line. Here gate electrodes of the read and write select transistors are connected t the write/read select line and are distinguished by having different threshold voltages.

Other reference include U.S. Pat. Nos. 4,434,433; 4,308,595; 4,203,159; 4,044,342; 3,919,569 and IBM Technical Disclosure Bulletins Vol. 23, No. 10 Mar, 1981, Page 462 and Vol. 18, No. 3, Page 649 Aug, 1975.

SUMMARY OF THE INVENTION

An object of the present invention is to provide a complementary MOS one-capacitor dynamic RAM cell which operates with a non-boosted wordline without a threshold loss problem.

Another object of the present invention is to provide a CMOS one storage capacitor DRAM cell that incorporates both n- and p-type transfer devices connected to the storage capacitor.

A further object of the present invention is to provide a true CMOS DRAM cell with two complementary transistor devices having gates controlled by complementary wordlines.

The foregoing and other objects, features and advantages of the invention will be apparent from the following more particular description of the invention as illustrated in the accompanying drawings.

DESCRIPTION OF THE PREFERRED EMBODIMENTS

In integrated circuit technology employing dynamic-random-access-memory (DRAM) cells, as the DRAM density increases, it is important to scale down the area Step (15) Implant arsenic dopants to obtain n+source/drain junctions 54,56 for n-channel transfer devices and grow oxide to cover the device.

Step (16) Deposit blanket glass film and reflow.

Step (17) Etch contact holes 84, deposit and pattern metal level 86.

Figure 1:
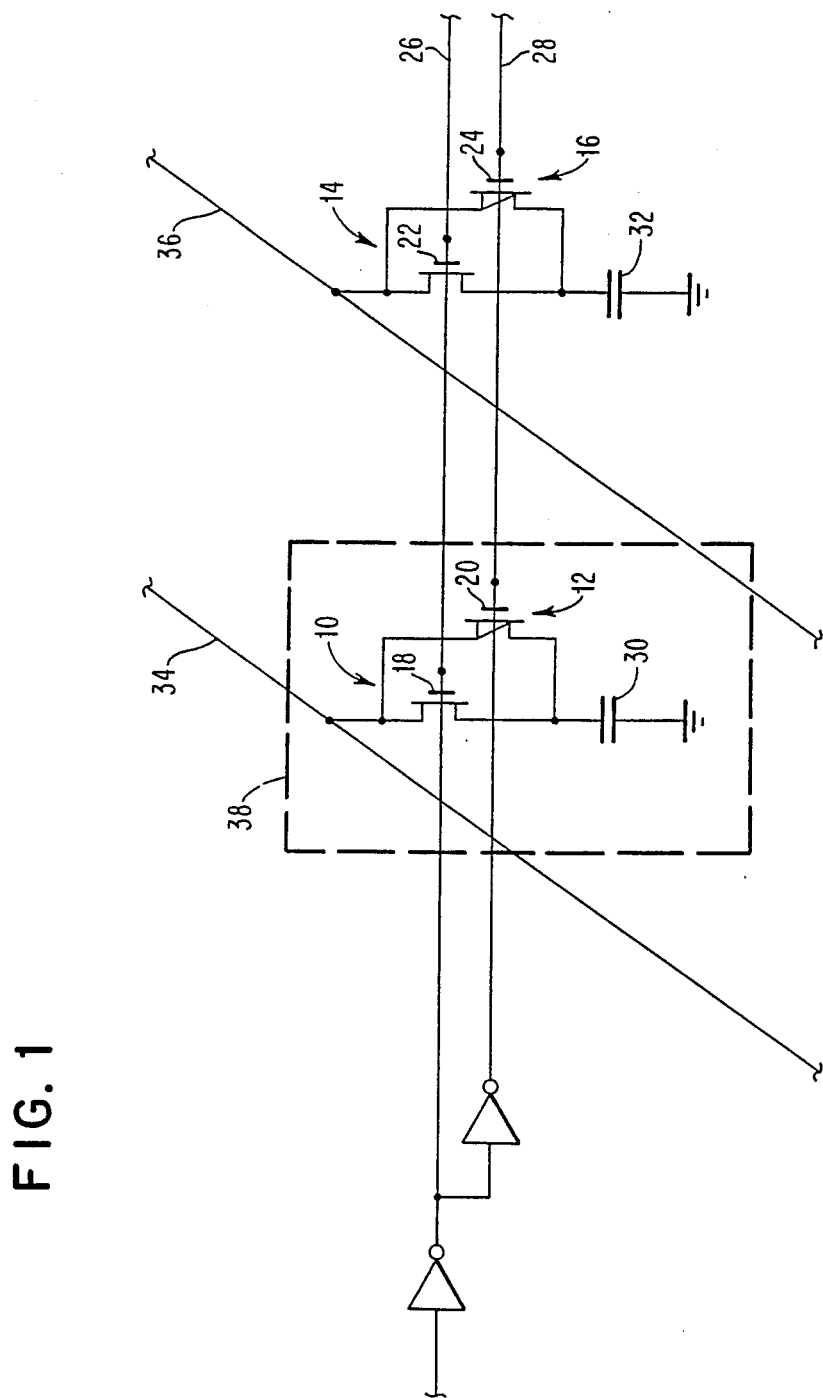
FIG. 1 is a schematic circuit diagram of a CMOS memory cell according to the principles of the present invention.
Figure 2:
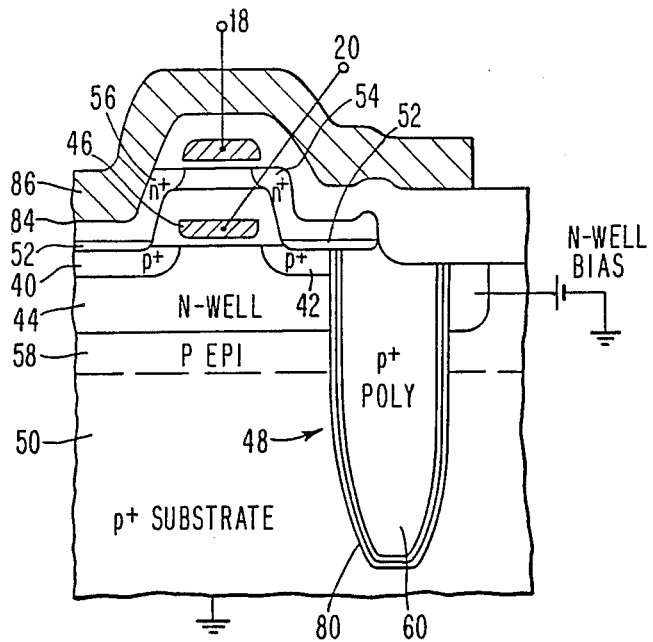
FIG. 2 is a schematic cross-sectional illustration of the structure of a CMOS memory cell according to the principles of the present invention.

This results in the cell structure shown in FIG. 2.

Figure 5:
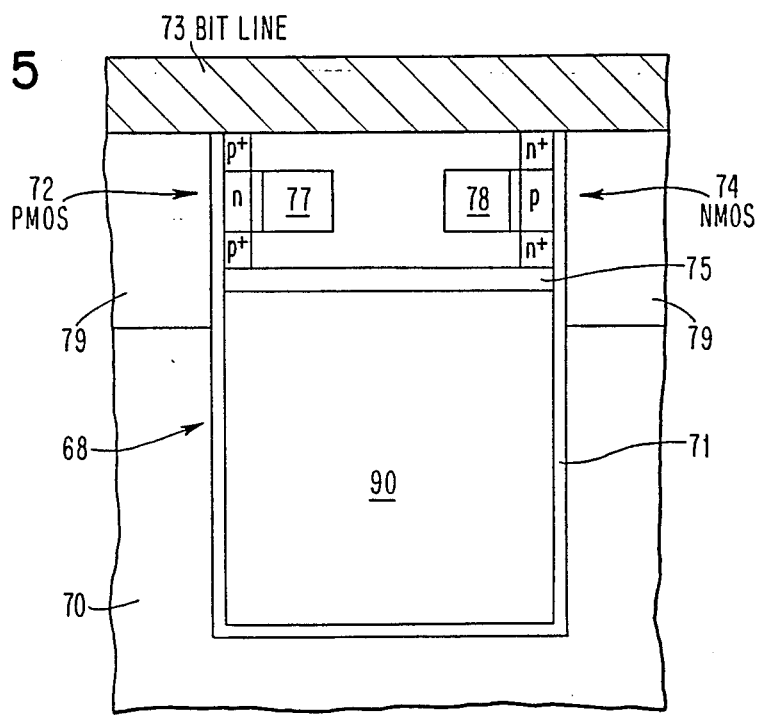
FIG. 5 is a schematic cross-sectional illustration of another embodiment of a CMOS memory cell according to the principles of the present invention.
Figure 3:
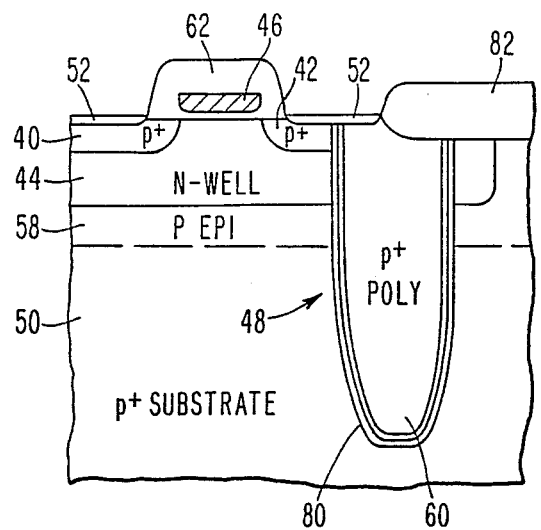
FIGS. 3 and 4 are schematic cross-sectional illustrations of the structure of the CMOS cell of FIG. 2 at certain steps within the fabrication process therefor.
Figure 4:
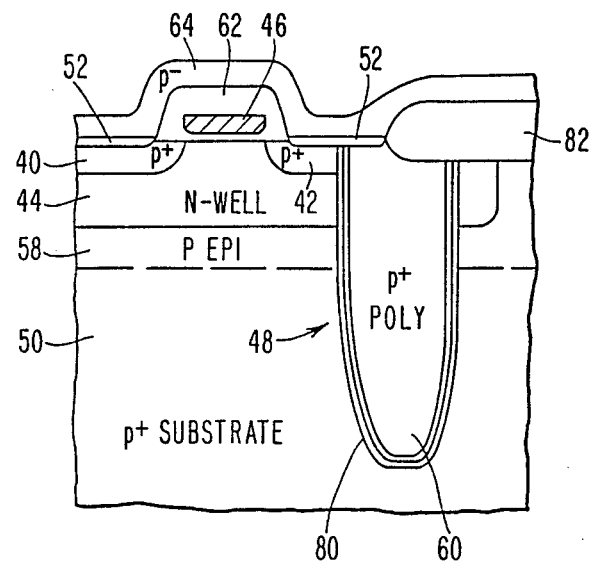

Another embodiment of a structure of a CMOS-1C cell according to the present invention is depicted in FIG. 5. In this idealized structure, the CMOS pass gate is comprised of the PMOS device 72 and the NMOS device 74; both devices 72 and 74 are vertical transistors, fully insulated from surrounding conducting materials, except for contacts to the bit line 73 and a connecting silicide or metal strap 75. The entire cell, including the poly gates 77 and 78, which are interconnected with the gates of other cells to form complementary wordlines, can be built in trenches 68 etched into a conductive substrate 70 covered by a thick insulator 79. The storage capacitor consists of poly electrode 90, thin oxide dielectric 71, and the plate 70. The polyelectrode 90 is interconnected to the device diffusions by the conductive strap 75.

Having thus described our invention, what we claim as new, and desire to secure by Letters Patent is:

1. A memory cell structure for a dynamic semiconductor memory array of the type including pairs of wordlines having a first wordline for transmitting a first wordline signal manifesting first and second signal levels and a second wordline for transmitting a second wordline signal manifesting two signal levels complementary to said first and second signal levels of said first wordline signal, said memory array further including bit lines, said memory cell structure being connected between a bit line and a pair of wordlines of said memory array and comprising an NMOS type transistor device including first, second and gate electrodes, a PMOS type transistor device including first, second and gate electrodes, and a storage capacitor wherein said first electrode of said NMOS type transistor device is connected to said first electrode of said PMOS type transistor device and to a bit line of said memory array, and said second electrode of said NMOS type transistor device is connected to said second electrode of said PMOS type transistor device and to said storage capacitor, said gate electrode of said NMOS type transistor device is connected to said first wordline of said pair and said gate electrode of said PMOS type transistor device is connected to said second wordline of said pair, said NMOS and PMOS type transistor devices both being turned off in response to a first signal level on said first wordline and said complementary signal level thereof on said second wordline, and said NMOS and PMOS type transistor devices being both turned on in response to a second signal level on said first wordline and said complementary signal level thereof on said second wordline, and wherein said bit line is electrically connected to said storage capacitor and charge is stored into and read out from said storage capacitor in response to said NMOS and PMOS type transistor devices being turned on and off by said signals on said wordlines.

2. A memory cell according to claim 1 wherein said first electrodes of said NMOS type transistor device is a source electrode and said first electrode of said PMOS type transistor device is a drain electrode, and said second electrode of said NMOS type transistor device is a drain electrode and said second electrode of said PMOS type transistor device is a source electrode.

3. A memory cell according to claim 1 wherein said first electrode of said NMOS type transistor device is a drain electrode, and said second electrodes of said NMOS type transistor device is a source electrode, said first electrode o said PMOS type transistor device is a source electrode, and said second electrode of said PMOS type transistor device is a drain electrode.

4. A memory cell according to claim 1 including a semiconductor substrate,
    an epitaxial silicon layer disposed on said substrate,
    an n-well region implanted in said epitaxial layer,
    a polysilicon filled trench disposed in said substrate and epitaxial layers and insulated therefrom to form said storage capacitor,
    said PMOS type transistor device disposed on said epitaxial layer and including source and drain impurity regions implanted into said n-well region and an oxide covered gate electrode disposed over said n-well region proximate to said source and drain regions,
    said NMOS type transistor device vertically disposed over said PMOS type transistor device and including source and drain impurity regions disposed over and electrically connected to said source and drain regions of said PMOS type transistor device, and, an oxide covered gate electrode disposed over and electrically isolated from said gate electrode of said PMOS type transistor device.

5. A memory cell according to claim 4 further including a layer of conductive material disposed over said polysilicon filled trench, over said source region of said PMOS type transistor device and beneath said source region of said NMOS type transistor device to electrically connected said trench storage capacitor to said source regions.

6. A memory cell according to claim 4 wherein said substrate is composed of p+type silicon, said epitaxial silicon layer is p type, said polysilicon filled in said trench is p+type, said n-well is composed of a phosphorous implant and said source and drain regions of said PMOS and NMOS type transistor devices are formed of phosphorus and boron implants to provide graded source/drain junctions.

* * * * *